US012181338B2

(12) United States Patent
Song et al.

(10) Patent No.: US 12,181,338 B2
(45) Date of Patent: Dec. 31, 2024

(54) LUMINOUS FLUX TEST CIRCUITRY, TEST METHOD AND DISPLAY PANEL

(71) Applicants: Beijing BOE Optoelectronics Technology Co., Ltd., Beijing (CN); BOE Technology Group Co., Ltd., Beijing (CN)

(72) Inventors: Yifan Song, Beijing (CN); Wenchao Han, Beijing (CN); Zhaohui Meng, Beijing (CN); Wei Sun, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/925,214

(22) PCT Filed: Dec. 27, 2021

(86) PCT No.: PCT/CN2021/141611
§ 371 (c)(1),
(2) Date: Nov. 14, 2022

(87) PCT Pub. No.: WO2023/122878
PCT Pub. Date: Jul. 6, 2023

(65) Prior Publication Data
US 2024/0230403 A1      Jul. 11, 2024

(51) Int. Cl.
*G01J 1/44* (2006.01)
*G01R 31/265* (2006.01)
*G01J 1/42* (2006.01)

(52) U.S. Cl.
CPC ............ *G01J 1/44* (2013.01); *G01R 31/2656* (2013.01); *G01J 2001/4247* (2013.01); *G01J 2001/4473* (2013.01)

(58) Field of Classification Search
CPC ................. G01J 1/44; G01J 2001/4247; G01J 2001/4473; G01R 31/2656; G09G 3/36
(Continued)

(56) References Cited

U.S. PATENT DOCUMENTS 11,100,828 B2 *   8/2021   Chen ...................... G09G 3/006
2010/0096997 A1   4/2010   Ahn et al.
(Continued)

FOREIGN PATENT DOCUMENTS

CN   102103843 A   6/2011
CN   103491320 A   1/2014
(Continued)

*Primary Examiner* — Giovanni Astacio-Oquendo
(74) *Attorney, Agent, or Firm* — IPro, PLLC

(57) ABSTRACT

The present disclosure provides a luminous flux test circuitry, a test method and a display panel. The luminous flux test circuitry includes two test sub-circuitries, a control sub-circuitry and a light-shielding pattern. Each test sub-circuitry includes N photosensitive transistors; an output end of each photosensitive transistor in a first test sub-circuitry is coupled to a first input end of the control sub-circuitry; an output end of each photosensitive transistor in a second test sub-circuitry is coupled to a second input end of the control sub-circuitry; the light-shielding pattern covers the photosensitive transistors in the second test sub-circuitry; at a sampling stage, the photosensitive transistors in each test sub-circuitry are in a reverse bias state; and the control sub-circuitry is configured to determine a luminous flux detected by the photosensitive transistors in the first test sub-circuitry in accordance with a leakage current generated by the photosensitive transistors in each test sub-circuitry.

19 Claims, 4 Drawing Sheets

(58) Field of Classification Search
USPC .......................................... 324/414, 408, 403
See application file for complete search history.

(56) References Cited

U.S. PATENT DOCUMENTS

| | | | |
|---|---|---|---|
| 2011/0148834 A1 | 6/2011 | Baek | |
| 2019/0296177 A1* | 9/2019 | Wang | .................. H01L 31/1136 |
| 2020/0326234 A1* | 10/2020 | Tzeng | ....................... G01J 1/44 |
| 2020/0355549 A1 | 11/2020 | Xu | |

FOREIGN PATENT DOCUMENTS

| | | |
|---|---|---|
| CN | 106407844 A | 2/2017 |
| CN | 107785403 A | 3/2018 |
| CN | 109642819 A | 4/2019 |
| CN | 109711391 A | 5/2019 |
| CN | 113108905 A | 7/2021 |

\* cited by examiner

LUMINOUS FLUX TEST CIRCUITRY, TEST METHOD AND DISPLAY PANEL

CROSS-REFERENCE TO RELATED APPLICATION

This application is the U.S. national phase of PCT Application No. PCT/CN2021/141611 filed on Dec. 27, 2021, which is incorporated herein by reference in its entirety.

TECHNICAL FIELD

The present disclosure relates to the field of display technology, in particular to a luminous flux test circuitry, a test method thereof and a display panel.

BACKGROUND

With the continuous development of the display technology, a display product has been widely used, and the user experience of the display product is highly demanded. In order to improve the user experience of the display product, light in an environment where the display product is used is detected, and light emission of the display product is adjusted in accordance with s detection result, so as to improve a user's visual effect when an image is displayed by the display product.

SUMMARY

An object of the present disclosure is to provide a luminous flux test circuitry, a test method thereof and a display panel, so as to solve problems in the related art.

The present disclosure provides the following technical solutions.

In one aspect, the present disclosure provides in some embodiments a luminous flux test circuitry, including two test sub-circuitries, a control sub-circuitry and a light-shielding pattern. Each of the two test sub-circuitries includes N photosensitive transistors, where N is a positive integer greater than or equal to 1; an output end of each of the N photosensitive transistors in a first test sub-circuitry of the two test sub-circuitries is coupled to a first input end of the control sub-circuitry; an output end of each of the N photosensitive transistors in a second test sub-circuitry of the two test sub-circuitries is coupled to a second input end of the control sub-circuitry; the light-shielding pattern covers the N photosensitive transistors in the second test sub-circuitry; at a sampling stage, the N photosensitive transistors in each test sub-circuitry are in a reverse bias state; and the control sub-circuitry is configured to determine luminous flux detected by the N photosensitive transistors in the first test sub-circuitry in accordance with a leakage current generated by the N photosensitive transistors in each test sub-circuitry.

In a possible embodiment of the present disclosure, each of the two test sub-circuitries further includes a reversed-phase integrator, a first input end of the reversed-phase integrator is coupled to the output end of each of the N photosensitive transistors, and a second input end of the reversed-phase integrator is coupled to a grounded signal; an output end of the reversed-phase integrator in the first test sub-circuitry is coupled to the first input end of the control sub-circuitry, and an output end of the reversed-phase integrator in the second test sub-circuitry is coupled to the second input end of the control sub-circuitry; and at the sampling stage, the reversed-phase integrator in the first test sub-circuitry is configured to store electric charges generated by the leakage current in the N photosensitive transistors coupled to the reversed-phase integrator to obtain a first output voltage, and transmit the first output voltage to the first input end of the control sub-circuitry; the reversed-phase integrator in the second test sub-circuitry is configured to store electric charges generated by the leakage current in the N photosensitive transistors coupled to the reversed-phase integrator to obtain a second output voltage, and transmit the second output voltage to the second input end of the control sub-circuitry; and the control sub-circuitry is configured to determine the luminous flux detected by the N photosensitive transistors in the first test sub-circuitry in accordance with the first output voltage and the second output voltage.

In a possible embodiment of the present disclosure, each reversed-phase integrator includes a first operational amplifier, a first resistor unit, a second resistor unit, and a capacitor unit; a first end of the first resistor unit is used as the first input end of the reversed-phase integrator, and a second end of the first resistor unit is coupled to a first input end of the first operational amplifier; a first end of the second resistor unit is used as the second input end of the reversed-phase integrator, and a second end of the second resistor unit is coupled to a second input end of the first operational amplifier; and a first end of the capacitor unit is coupled to the first input end of the first operational amplifier, a second end of the capacitor unit is coupled to an output end of the first operational amplifier, and the output end of the first operational amplifier is used as the output end of the reversed-phase integrator.

In a possible embodiment of the present disclosure, each test sub-circuitry further includes a control unit coupled to a control signal input end, the first end of the capacitor unit and the second end of the capacitor unit, and configured to control the first end of the capacitor unit to be electrically coupled to or electrically decoupled from the second end of the capacitor unit under the control of a control signal from the control signal input end.

In a possible embodiment of the present disclosure, each test sub-circuitry further includes a reversed-phase operational amplifier, an in-phase input end of the reversed-phase operational amplifier is coupled to the grounded signal, and a reversed-phase input end of the reversed-phase operational amplifier is coupled to the output end of the first operational amplifier; an output end of the reversed-phase operational amplifier in the first test sub-circuitry is coupled to the first input end of the control sub-circuitry; and an output end of the reversed-phase operational amplifier in the second test sub-circuitry is coupled to the second input end of the control sub-circuitry.

In a possible embodiment of the present disclosure, the control sub-circuitry includes a first analog-to-digital converter, a second analog-to-digital converter and a control chip; an input end of the first analog-to-digital converter is used as the first input end of the control sub-circuitry, and an output end of the first analog-to-digital converter is coupled to the control chip; and an input end of the second analog-to-digital converter is used as the second input end of the control sub-circuitry, and an output end of the second analog-to-digital converter is coupled to the control chip.

In a possible embodiment of the present disclosure, in the case that N is greater than 1, gate electrodes of the N photosensitive transistors are coupled to each other and input ends of the N photosensitive transistors are coupled to each other in a same test sub-circuitry.

In a possible embodiment of the present disclosure, the gate electrodes of the N photosensitive transistors in the first test sub-circuitry are coupled to the gate electrodes of the N photosensitive transistors in the second test sub-circuitry; and the input ends of the N photosensitive transistors in the first test sub-circuitry are coupled to the input ends of the N photosensitive transistors in the second test sub-circuitry.

In another aspect, the present disclosure provides in some embodiments a luminous flux test method for the above-mentioned luminous flux test circuitry, including, at the sampling stage, enabling the N photosensitive transistors in each test sub-circuitry to be in the reverse bias state, and determining, by the control sub-circuitry, the luminous flux detected by the N photosensitive transistors in the first test sub-circuitry in accordance with the leakage current generated by the N photosensitive transistors in each test sub-circuitry.

In a possible embodiment of the present disclosure, each of the two test sub-circuitries further includes a reversed-phase integrator, a first input end of the reversed-phase integrator is coupled to an output end of each of the N photosensitive transistors, a second input end of the reversed-phase integrator is coupled to a grounded signal, an output end of the reversed-phase integrator in the first test sub-circuitry is coupled to the first input end of the control sub-circuitry, and an output end of the reversed-phase integrator in the second test sub-circuitry is coupled to the second input end of the control sub-circuitry. The determining, by the control sub-circuitry, the luminous flux detected by the N photosensitive transistors in the first test sub-circuitry in accordance with the leakage current generated by the N photosensitive transistors in each test sub-circuitry includes: storing, by the reversed-phase integrator in the first test sub-circuitry, electric charges generated by the leakage current in the N photosensitive transistors coupled to the reversed-phase integrator to obtain a first output voltage, and transmitting the first output voltage to the first input end of the control sub-circuitry; storing, by the reversed-phase integrator in the second test sub-circuitry, electric charges generated by the leakage current in the N photosensitive transistors coupled to the reversed-phase integrator to obtain a second output voltage, and transmitting the second output voltage to the second input end of the control sub-circuitry; and determining, by the control sub-circuitry, the luminous flux detected by the N photosensitive transistors in the first test sub-circuitry in accordance with the first output voltage and the second output voltage.

In a possible embodiment of the present disclosure, the luminous flux test method further includes, at a resetting stage, resetting the N photosensitive transistors in each of the two test sub-circuitries.

In a possible embodiment of the present disclosure, each reversed-phase integrator includes a first operational amplifier, a first resistor unit, a second resistor unit, and a capacitor unit; a first end of the first resistor unit is used as the first input end of the reversed-phase integrator, and a second end of the first resistor unit is coupled to a first input end of the first operational amplifier; a first end of the second resistor unit is used as the second input end of the reversed-phase integrator, and a second end of the second resistor unit is coupled to a second input end of the first operational amplifier; a first end of the capacitor unit is coupled to the first input end of the first operational amplifier, a second end of the capacitor unit is coupled to an output end of the first operational amplifier, and the output end of the first operational amplifier is used as the output end of the reversed-phase integrator. The test sub-circuitry further includes a control unit coupled to a control signal input end, the first end of the capacitor unit and the second end of the capacitor unit. The luminous flux test method further includes: at the sampling stage, controlling, by the control unit, the first end of the capacitor unit to be electrically decoupled from the second end of the capacitor unit under the control of a control signal from the control signal input end; and at the resetting stage, controlling, by the control unit, the first end of the capacitor unit to be electrically coupled to the second end of the capacitor unit under the control of the control signal from the control signal input end.

In yet another aspect, the present disclosure provides in some embodiments a display panel integrated with the above-mentioned luminous flux test circuitry.

In a possible embodiment of the present disclosure, the display panel includes a thin film transistor, a type of each of the photosensitive transistors in the luminous flux test circuitry is the same as a type of the thin film transistor, and the photosensitive transistors and the thin film transistor are formed at the same time.

In a possible embodiment of the present disclosure, the display panel further includes a first signal line and a second signal line, the first signal line is coupled to the gate electrodes of the photosensitive transistors, and the second signal line is coupled to the input ends of the photosensitive transistors.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

The present disclosure will be described hereinafter in conjunction with the drawings and embodiments.

In the related art, when detecting light in an environment, generally a sampling sensor is externally attached to a display panel, and aluminous flux formed through ambient light on the display panel is collected by the sampling sensor. However, there are the following problems. (1) The external sampling sensor on the display panel not only needs to occupy a large space but also has a high cost. (2) A large characteristic drift occurs for the sampling sensor becomes larger with the elapse of time, resulting in a decrease in the detection accuracy of the sampling sensor. (3) Large power consumption is generated during the operation of the sampling sensor.

Figure 1:
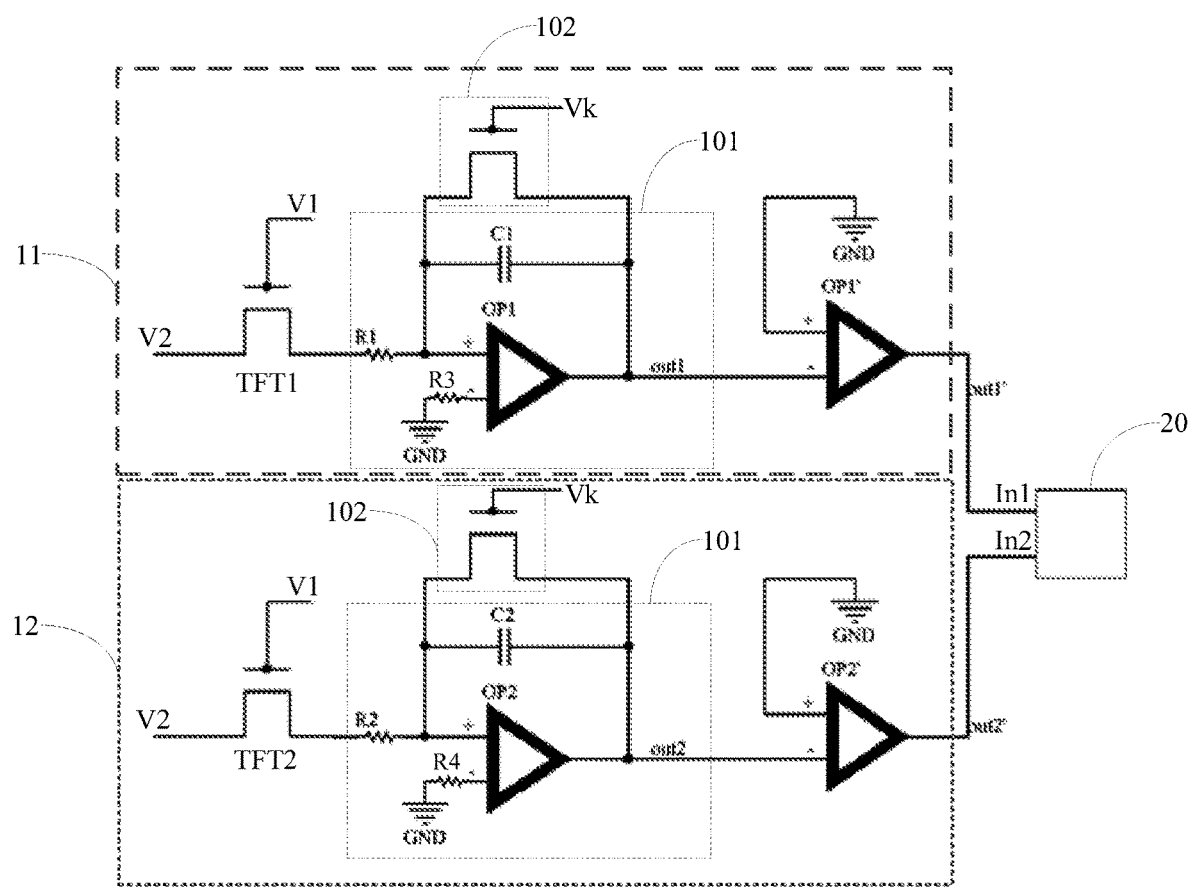
FIG. 1 is a circuit diagram of a luminous flux test circuitry according to one embodiment of the present disclosure.

As shown in FIG. 1, the present disclosure provides in some embodiments a luminous flux test circuitry, including two test sub-circuitries (such as a first test sub-circuitry 11 and a second test sub-circuitry 12), a control sub-circuitry 20 and a light-shielding pattern. Each of the two test sub-circuitries includes N photosensitive transistors (such as a photosensitive transistor TFT1 and a photosensitive transistor TFT2), where N is a positive integer greater than or equal to 1. An output end of each of the N photosensitive transistors TFT1 in the first test sub-circuitry 11 of the two test sub-circuitries is coupled to a first input end In1 of the control sub-circuitry 20, an output end of each of the N photosensitive transistors TFT2 in the second test sub-circuitry 12 of the two test sub-circuitries is coupled to a second input end In2 of the control sub-circuitry 20, and the light-shielding pattern covers the N photosensitive transistors TFT2 in the second test sub-circuitry 12. At a sampling stage, the N photosensitive transistors in each test sub-circuitry are in a reverse bias state. The control sub-circuitry 20 is configured to determine a luminous flux detected by the N photosensitive transistors TFT1 in the first test sub-circuitry 11 in accordance with a leakage current generated by the N photosensitive transistors in each test sub-circuitry.

For example, the N photosensitive transistors TFT1 in the first test sub-circuitry 11 of the two test sub-circuitries are not shielded by the light-shielding pattern, i.e., a non-shielded test sub-circuitry is formed. The N photosensitive transistors TFT2 in the second test sub-circuitry 12 of the two test sub-circuitries are shielded by the light-shielding pattern, i.e., a shielded test sub-circuitry is formed as a control test sub-circuitry.

For example, when the luminous flux test circuitry is integrated in a display panel, the light-shielding pattern is a black matrix in the display panel.

For example, a structure of the first test sub-circuitry is the same as a structure of the second test sub-circuitry. Each of the photosensitive transistors is a metal-oxide-semiconductor (MOS) transistor, such as a p-type MOS (PMOS) transistor, or an n-type MOS (NMOS) transistor. Different signals need to be applied to gate electrodes and input electrodes of different types of transistors when the transistors are in the reverse bias state. In addition, when the photosensitive transistors include different types of transistors, a correspondence between the leakage current of the transistors and the luminous flux is different.

When each of the photosensitive transistors is an NMOS transistor, at the sampling stage in one frame, a constant positive potential signal is applied to an input end V2 (i.e., a source electrode) of the photosensitive transistor, and a potential of the constant positive potential signal is consistent with a VGH signal (i.e., a high-level signal) required by the display panel to facilitate the power supply. At the same time, a negative potential signal is applied to a gate electrode V1 of the photosensitive transistor, and a potential of the negative potential signal is consistent with a VGL signal (i.e., a low-level signal) required by the display panel to facilitate the power supply. At this time, the photosensitive transistor outputs a leakage current Ioff For example, the leakage current outputted by the N photosensitive transistor in the first test sub-circuitry 11 is marked as Ioff1, and the leakage current outputted by the N photosensitive transistor in the second test sub-circuitry 12 is marked as Ioff2.

When the photosensitive transistor is in the reverse bias state, the leakage current flows from the input end to the output end, a size of the leakage current is affected by characteristics of the photosensitive transistor and a reverse bias voltage. When the reverse bias voltage is stable, the size of the leakage current merely depends on the characteristics of the photosensitive transistor. The characteristics of the photosensitive transistor change when the photosensitive transistor is irradiated at different luminous fluxes, and the size of the leakage current changes monotonically and positively with the luminous flux. Based on the relationship between the characteristics of the photosensitive transistor and the luminous flux, it is able to determine the luminous flux received by the photosensitive transistor through detecting the leakage current outputted by the photosensitive transistor, and based on a value of the luminous flux, it is able to judge how to control backlight at the current luminous flux to provide a better display effect.

It should be appreciated that, the reverse bias voltage is a voltage applied to the gate electrode and the input end of the photosensitive transistor to enable the photosensitive transistor to be in the reverse bias state.

At the sampling stage in one frame, the leakage current from the photosensitive transistor increases positively with an increase in the luminous flux. In this regard, through recording a formula for converting electrical data into optical data in advance, it is able to determine the value of the luminous flux received by the photosensitive transistor in accordance with the formula and the leakage current outputted by the photosensitive transistor.

Figure 3:
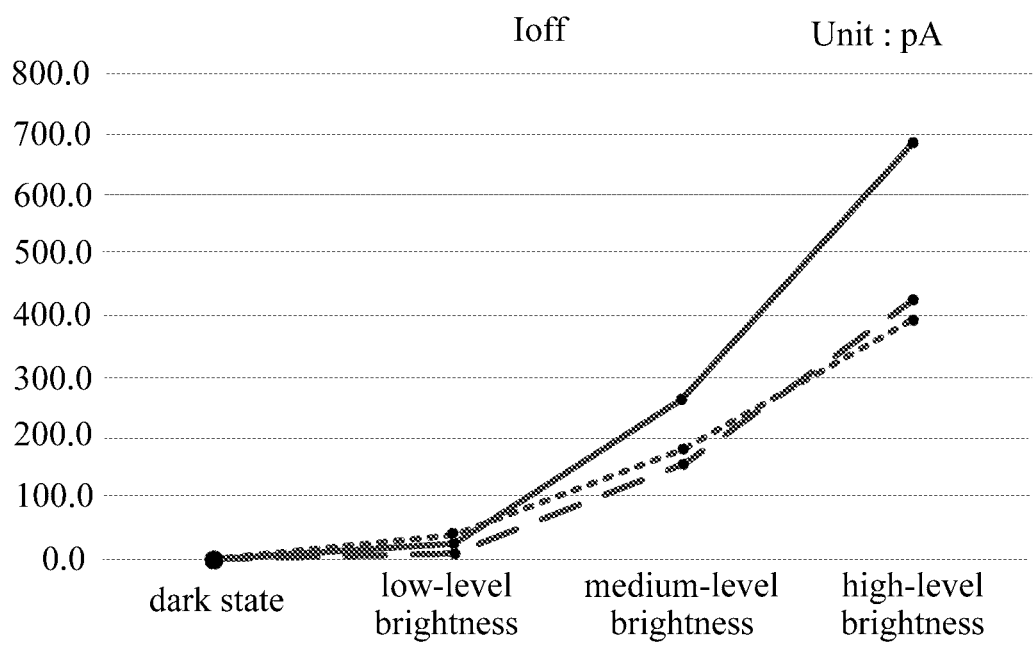
FIG. 3 is a schematic view showing a positive correlation between a leakage current and an illumination condition according to one embodiment of the present disclosure.

In the case that the photosensitive transistor is in the reverse bias state, FIG. 3 shows a curve between the leakage current Ioff of the photosensitive transistor and an illumination condition.

According to the structure of the above luminous flux test circuitry, in the embodiments of the present disclosure, the luminous flux test circuitry is provided with two test sub-circuitries with a same structure, the photosensitive transistors in the first test sub-circuitry 11 of the two test sub-circuitries are not shielded by the light-shielding pattern, and the photosensitive transistors in the second test sub-circuitry 12 of the two test sub-circuitries are shielded by the light-shielding pattern. At the sampling stage, the photosensitive transistors in the two test sub-circuitries are in the reverse bias state to generate the leakage current, and the control sub-circuitry 20 determines the luminous flux detected by the N photosensitive transistors in the first test sub-circuitry 11 in accordance with leakage current generated by the N photosensitive transistors in each test sub-circuitry. In this regard, according to the luminous flux test circuitry in the embodiments of the present disclosure, it is able to inversely deduce the luminous flux detected by the photosensitive transistors in the first test sub-circuitry 11 through a difference between the leakage current generated by the photosensitive transistors in the first test sub-circuitry 11 and the leakage current generated by the photosensitive transistors in the second test sub-circuitry 12.

According to the embodiments of the present disclosure, the luminous flux test circuitry is directly integrated in the display panel without occupying a large space, and the photosensitive transistors in the luminous flux test circuitry are formed together with transistors of a same type in the display panel, so as to effectively reduce the manufacturing cost.

According to the luminous flux test circuitry in the embodiments of the present disclosure, the photosensitive transistors are in the reverse bias state, and the luminous flux is determined in accordance with the leakage current generated by the photosensitive transistors in the reverse bias state. A small characteristic drift of occurs for the transistor in the reverse bias state with the elapse of time, so it is able to improve the accuracy of the luminous flux determined by the luminous flux test circuitry.

According to the luminous flux test circuitry in the embodiments of the present disclosure, the photosensitive transistor is in the reverse bias state, the reverse bias voltage applied to the gate electrode and the input end of the photosensitive transistor is a direct current signal, so it is able to effectively reduce the power consumption generated by the photosensitive transistor.

Figure 2:
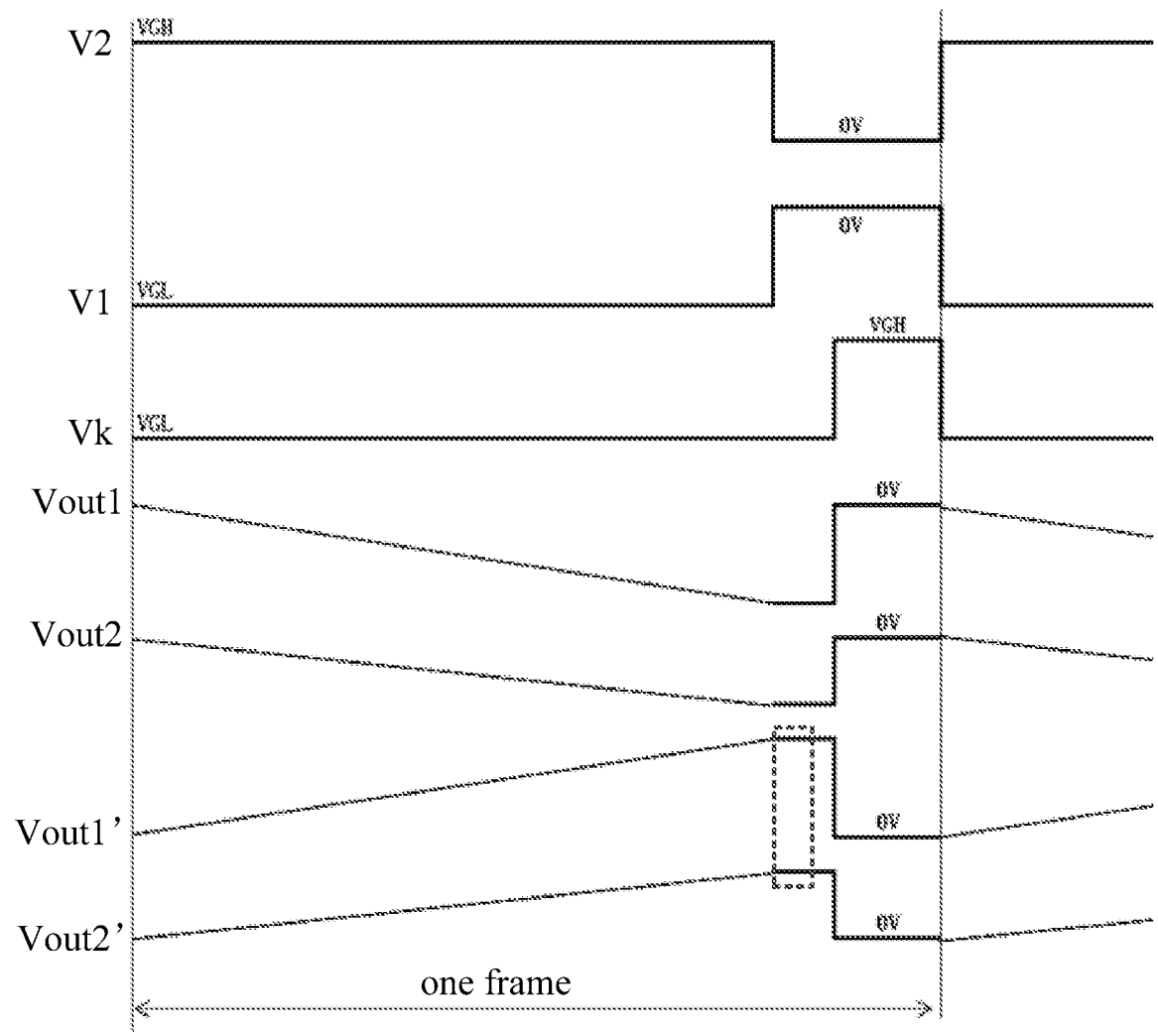
FIG. 2 is a sequence diagram of the luminous flux test circuitry according to one embodiment of the present disclosure.

As shown in FIG. 1 and FIG. 2, in some embodiments of the present disclosure, each of the two test sub-circuitries further includes a reversed-phase integrator 101, a first input end of the reversed-phase integrator 101 is coupled to the output end of the N photosensitive transistors, and a second input end of the reversed-phase integrator 101 is coupled to a grounded signal GND. An output end out1 of the reversed-phase integrator 101 in the first test sub-circuitry 11 is coupled to the first input end In1 of the control sub-circuitry 20, and an output end out2 of the reversed-phase integrator 101 in the second test sub-circuitry 12 is coupled to the second input end In2 of the control sub-circuitry 20. At the sampling stage, the reversed-phase integrator 101 in the first test sub-circuitry 11 stores electric charges generated by the leakage current in the N photosensitive transistors TFT1 coupled to the reversed-phase integrator 101 to obtain a first output voltage, and transmits the first output voltage to the first input end In1 of the control sub-circuitry 20. The reversed-phase integrator 101 in the second test sub-circuitry 12 stores electric charges generated by the leakage current in the N photosensitive transistors TFT2 coupled to the reversed-phase integrator 101 to obtain a second output voltage, and transmits the second output voltage to the second input end In2 of the control sub-circuitry 20. The control sub-circuitry 20 determines the luminous flux detected by the N photosensitive transistors TFT1 in the first test sub-circuitry 11 in accordance with the first output voltage and the second output voltage.

For example, in the first test sub-circuitry 11, the reversed-phase integrator 101 accumulates the electric charges generated by the leakage current in the N photosensitive transistors TFT1 in a sampling time period, an potential outputted by an output end of the N photosensitive transistors is defined as Voff1, and the first output voltage outputted by the output end out1 of the reversed-phase integrator 101 is Vout1.

For example, in the second test sub-circuitry 12, the reversed-phase integrator 101 accumulates the electric charges generated by the leakage current in the N photosensitive transistors TFT2 in the sampling time period, an potential outputted by an output end of the N photosensitive transistors is defined as Voff2, and the second output voltage outputted by the output end out2 of the reversed-phase integrator 101 is Vout2.

For example, in each of the two test sub-circuitries, Vout1 and Vout2 change gradually (increase gradually or decrease gradually) to be in a stable state during the accumulation of the electric charges through the reversed-phase integrator 101. The control sub-circuitry 20 determines the luminous flux detected by the N photosensitive transistors TFT1 in the first test sub-circuitry 11 in accordance with the stable first output voltage and the stable second output voltage.

According to the luminous flux test circuitry in the embodiments of the present disclosure, the reversed-phase integrator 101 accumulates the electric charges generated by the leakage current in the photosensitive transistors in the sampling time period, so it is able to improve the accuracy of the stable first output voltage and the stable second output voltage, thereby to improve the accuracy of the determined luminous flux.

As shown in FIG. 1, in some embodiments of the present disclosure, each reversed-phase integrator 101 includes a first operational amplifier (such as a first operational amplifier OPT and a first operational amplifier OP2), a first resistor unit (such as a first resistor unit R1 and a first resistor unit R2), a second resistor unit (such as a second resistor unit R3 and a second resistor unit R4), and a capacitor unit (such as a capacitor unit C1 and a capacitor unit C2). A first end of the first resistor unit is used as the first input end of the reversed-phase integrator 101 and coupled to the grounded signal, and a second end of the first resistor unit is coupled to a first input end of the first operational amplifier. A first end of the second resistor unit is used as the second input end of the reversed-phase integrator 101, and a second end of the second resistor unit is coupled to a second input end of the first operational amplifier. A first end of the capacitor unit is coupled to the first input end of the first operational amplifier, a second end of the capacitor unit is coupled to an output end of the first operational amplifier, and the output end of the first operational amplifier is used as the output end of the reversed-phase integrator 101.

For example, a resistance of the first resistor unit R1 is the same as a resistance of the first resistor unit R2, and a resistance of the second resistor unit R3 is the same as a resistance of the second resistor unit R4. For example, the resistances of the first resistor unit R1, the first resistor unit R2, the second resistor unit R3, and the second resistor unit R4 are each 0.

For example, the resistance of the first resistor unit R1 is the same as the resistance of the second resistor unit R3, and the resistance of the first resistor unit R2 is the same as the resistance of the second resistor unit R4.

For example, the first input end of the first operational amplifier is a reversed-phase input end, and the second input end of the first operational amplifier is an in-phase input end.

For example, the first input end of the first operational amplifier is the in-phase input end, and the second input end of the first operational amplifier is the reversed-phase input end.

The operation of the reversed-phase integrator 101 will be described hereinafter in details when the first input end of the first operational amplifier is the in-phase input end and the second input end of the first operational amplifier is the reversed-phase input end.

In one frame of the sampling time period, the first test sub-circuitry 11 includes the first operational amplifier OP1, the first resistor unit R1, the second resistor unit R3 and the capacitor unit C1, and the capacitor unit C1 accumulates the electric charges generated by the leakage current in the N photosensitive transistors TFT1 in the sampling time period. The second test sub-circuitry 12 includes the second operational amplifier OP2, the first resistor unit R2, the second resistor unit R4 and the capacitor unit C2, and the capacitor unit C2 accumulates the electric charges generated by the leakage current in the N photosensitive transistors TFT2 in the sampling time period.

Depending on a virtual short circuit principle of the operational amplifier, currents passing through the first resistor unit R1 and the capacitor unit C1 are both Ioff1. Ioff1=(0−Voff1)/R1=C1*d(Vout1−0)/dt, so Vout1=−∫[Voff1/(R1×C1)]dt, and Vout2=−∫[Voff2/(R2×C2)]dt.

According to the luminous flux test circuitry in the embodiments of the present disclosure, the reversed-phase integrator 101 accumulates the electric charges generated by the leakage current in the photosensitive transistors in the sampling time period, so it is able to improve the accuracy of the stable first output voltage and the stable second output voltage, thereby to improve the accuracy of the determined luminous flux.

In the embodiments of the present disclosure, each test sub-circuitry further includes a control unit 102 coupled to a control signal input end, the first end of the capacitor unit and the second end of the capacitor unit, and configured to control the first end of the capacitor unit to be electrically coupled to or electrically decoupled from the second end of the capacitor unit under the control of a control signal Vk from the control signal input end.

For example, the control unit 102 includes a control transistor, a gate electrode of the control transistor is coupled to the control signal input end, a first electrode of the control transistor is coupled to the first end of the capacitor unit, and a second electrode of the control transistor is coupled to the second end of the capacitor unit. The control transistor is turned on or turned off under the control of the control signal Vk from the control signal input end.

At the sampling stage, the control unit 102 controls the first end of the capacitor unit to be electrically decoupled from the second end of the capacitor unit under the control of the control signal Vk from the control signal input end; and at the resetting stage, the control unit 102 controls the first end of the capacitor unit to be electrically coupled to the second end of the capacitor unit under the control of the control signal Vk from the control signal input end.

For example, the control transistor includes an NMOS transistor. At the sampling stage, the control signal Vk is maintained at a low potential to ensure that the control transistor is turned off; and at the resetting stage, the control signal Vk is at a high potential to enable the control transistor to be turned on.

Each of the two test sub-circuitries further includes the control unit 102, and the control unit 102 discharges and resets the capacitor unit C1 and the capacitor unit C2 at the resetting stage for start the sampling in a next frame.

As shown in FIG. 1 and FIG. 2, in some embodiments of the present disclosure, each test sub-circuitry further includes a reversed-phase operational amplifier (such as a reversed-phase operational amplifier OP1' and a reversed-phase operational amplifier OP2'), an in-phase input end of the reversed-phase operational amplifier is coupled to the grounded signal, and a reversed-phase input end of the reversed-phase operational amplifier is coupled to the output end of the first operational amplifier. An output end out1' of the reversed-phase operational amplifier OP1' in the first test sub-circuitry 11 is coupled to the first input end In1 of the control sub-circuitry 20, and an output end out2' of the reversed-phase operational amplifier OP2' in the second test sub-circuitry 12 is coupled to the second input end In2 of the control sub-circuitry 20.

For example, the first test sub-circuitry 11 includes the reversed-phase operational amplifier OP1', and the second test sub-circuitry 12 includes the reversed-phase operational amplifier OP2'.

A potential signal at the output end of the reversed-phase operational amplifier OP1' is $Vout1'=-Vout1=\int[Voff1/(R1 \times C1)]dt$, and a potential signal at the output end of the reversed-phase operational amplifier OP2' is $Vout2'=-Vout2=\int[Voff2/(R2 \times C2)]dt$.

In the case that R1=R2 and C1=C2, it is more convenient to directly determine the luminous flux received by the photosensitive transistors in accordance with a difference between Vout1' and Vout2'.

It should be appreciated that, operating voltages of the first operational amplifier and the reversed-phase operational amplifier are both within a range of the reverse bias voltage.

When each of the two test sub-circuitries further includes the reversed-phase operational amplifier, it is able to control the control sub-circuitry 20 to receive a signal with a positive potential, thereby to reduce the operation difficulty of the control sub-circuitry 20.

In some embodiments of the present disclosure, the control sub-circuitry 20 includes a first analog-to-digital converter, a second analog-to-digital converter and a control chip. An input end of the first analog-to-digital converter is used as the first input end In1 of the control sub-circuitry 20, and an output end of the first analog-to-digital converter is coupled to the control chip. An input end of the second analog-to-digital converter is used as the second input end In2 of the control sub-circuitry 20, and an output end of the second analog-to-digital converter is coupled to the control chip.

For example, the first analog-to-digital converter collects and records a potential value of Vout1' after Vout1' is stable at a highest potential, and converts the potential value into first data; and the second analog-to-digital converter collects and records a potential value of Vout2' after Vout2' is stable at a highest potential, and converts the potential value into second data, as indicated by the dotted box in FIG. 2.

It should be appreciated that, in the case that the test sub-circuitry does not include the reversed-phase operational amplifier, the first analog-to-digital converter collects and records a potential value of Vout1 after Vout1 is stable at a highest potential, and converts the potential value into first data; and the second analog-to-digital converter collects and records a potential value of Vout2 after Vout2 is stable at a highest potential, and converts the potential value into second data.

It should be appreciated that, in the case that the test sub-circuitry does not include the reversed-phase integrator 101 or the reversed-phase operational amplifier, the first analog-to-digital converter collects and records Voff1, and converts Voff1 into first data; and the second analog-to-digital converter collects and records Voff2, and converts Voff2 into second data. For example, in the case that the test sub-circuitry does not include the reversed-phase integrator 101 or the reversed-phase operational amplifier, a ground resistor is coupled to the output end of the photosensitive transistor TFT1 in the first test sub-circuitry, and a ground resistor is coupled to the output end of the photosensitive transistor TFT2 in the second test sub-circuitry.

Figure 4:
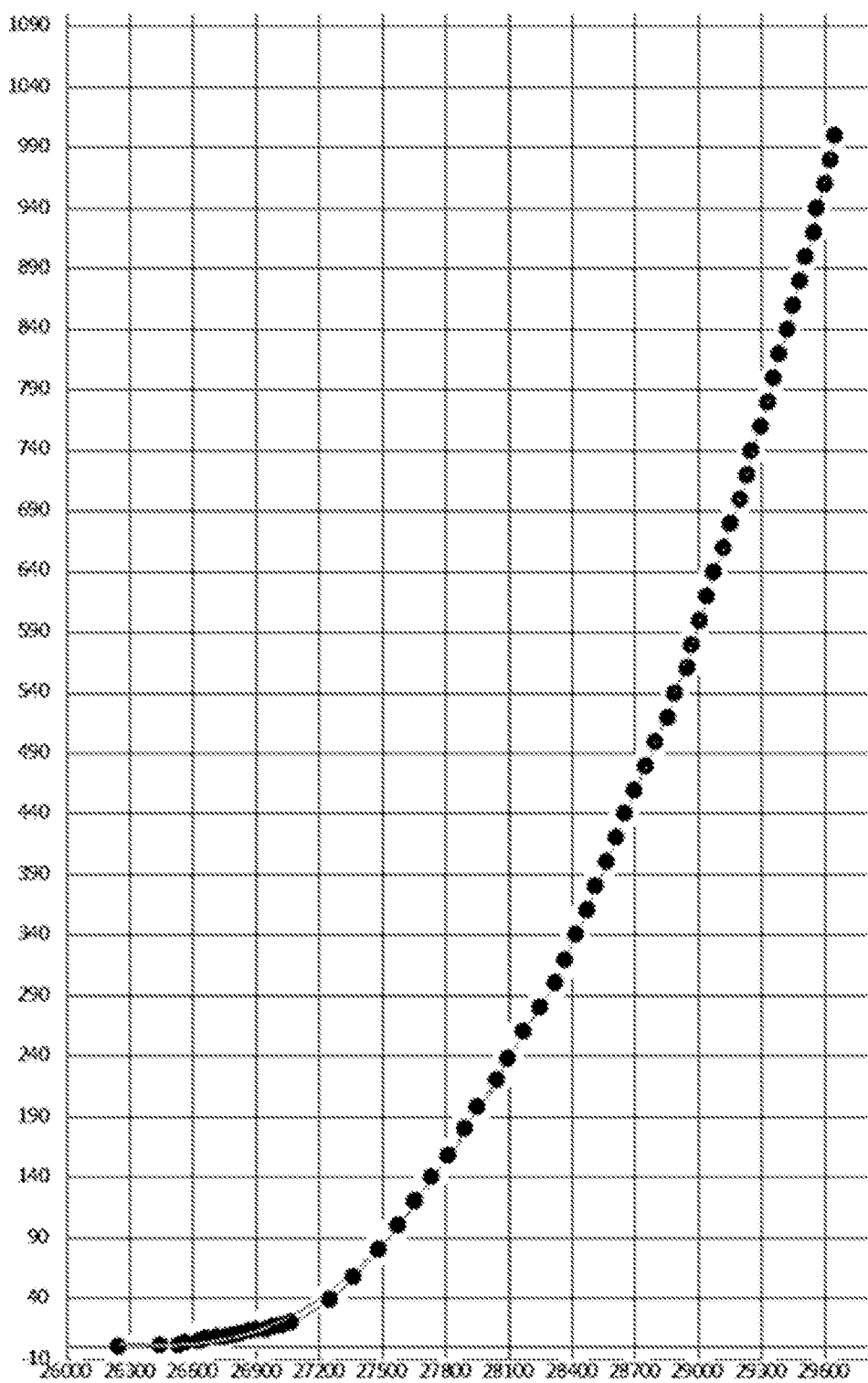
FIG. 4 is a schematic view showing a positive correlation between a data volume and a luminous flux according to one embodiment of the present disclosure.

For example, the control chip (such as a micro control unit (MCU) 102) records a monotonic formula (i.e., a relational expression) between a data volume and the luminous flux in advance. The control chip calculates a difference between the first data and the second data to obtain a corresponding data volume, and obtains the luminous flux based on the monotonic formula. As shown in FIG. 4, for example, if the data volume is 28700, the luminous flux is about 440 lux. It should be appreciated that, in FIG. 4, the abscissa represents the data volume, and the ordinate represents the luminous flux.

It should be appreciated that, the monotonic formula varies with the structure of the test sub-circuitry. For example, the monotonic formula is used to reflect a correspondence between the leakage current and the luminous flux.

In some embodiments of the present disclosure, in the case that N is greater than 1, gate electrodes of the N photosensitive transistors are coupled to each other, input ends of the N photosensitive transistors are coupled to each other, and output ends of the N photosensitive transistors are coupled to each other in a same test sub-circuitry.

When the same test sub-circuitry includes a plurality of photosensitive transistors, it is able to improve the accuracy of the obtained luminous flux.

In some embodiments of the present disclosure, the gate electrodes of the N photosensitive transistors in the first test sub-circuitry 11 are coupled to the gate electrodes of the N photosensitive transistors in the second test sub-circuitry 12; an input end of the N photosensitive transistors in the in the first test sub-circuitry 11 are coupled to an input end of the N photosensitive transistors in the in the second test sub-circuitry 12.

Based on the above, the reverse bias state of the N photosensitive transistors in the first test sub-circuitry 11 is the same as the reverse bias state of the N photosensitive transistors in the second test sub-circuitry 12, so as to determine the luminous flux in accordance with the difference between the first data and the second data conveniently.

The present disclosure further provides in some embodiments a luminous flux test method for the above-mentioned luminous flux test circuitry, including: at the sampling stage, enabling the N photosensitive transistors in each test sub-circuitry to be in the reverse bias state; and determining, by the control sub-circuitry 20, the luminous flux sensed by the N photosensitive transistors in the first test sub-circuitry 11 in accordance with the leakage current generated by the N photosensitive transistors in each test sub-circuitry.

According to the embodiments of the present disclosure, the luminous flux test circuitry is provided with two test sub-circuitries with a same structure, the photosensitive transistors in the first test sub-circuitry 11 of the two test sub-circuitries are not shielded by the light-shielding pattern, and the photosensitive transistors in the second test sub-circuitry 12 of the two test sub-circuitries are shielded by the light-shielding pattern. At the sampling stage, the photosensitive transistors in the two test sub-circuitries are in the reverse bias state to generate the leakage current, and the control sub-circuitry 20 determines the luminous flux detected by the N photosensitive transistors in the first test sub-circuitry 11 in accordance with the leakage current generated by the N photosensitive transistors in each test sub-circuitry.

According to the luminous flux test method in the embodiments of the present disclosure, the luminous flux test circuitry is directly integrated in the display panel without occupying a large space, and the photosensitive transistors in the luminous flux test circuitry are formed together with transistors of a same type in the display panel, so as to effectively reduce the manufacture cost.

According to the luminous flux test method in the embodiments of the present disclosure, the photosensitive transistors are in the reverse bias state, and the luminous flux is determined in accordance with the leakage current generated by the photosensitive transistors in the reverse bias state. A small characteristic drift of occurs for the transistor in the reverse bias state with the elapse of time, so it is able to improve the accuracy of the luminous flux determined by the luminous flux test circuitry.

According to the luminous flux test method in the embodiments of the present disclosure, the photosensitive transistor is in the reverse bias state, the reverse bias voltage applied to the gate electrode and the input end of the photosensitive transistor is a direct current signal, so it is able to effectively reduce the power consumption generated by the photosensitive transistor.

In some embodiments of the present disclosure, each of the two test sub-circuitries further includes a reversed-phase integrator 101, a first input end of the reversed-phase integrator 101 is coupled to the output end of the N photosensitive transistors, a second input end of the reversed-phase integrator 101 is coupled to the grounded signal, an output end of the reversed-phase integrator 101 in the first test sub-circuitry 11 is coupled to the first input end In1 of the control sub-circuitry 20, and an output end of the reversed-phase integrator 101 in the second test sub-circuitry 12 is coupled to the second input end In2 of the control sub-circuitry 20. The determining, by the control sub-circuitry 20, the luminous flux detected by the N photosensitive transistors in the first test sub-circuitry 11 in accordance with the leakage current generated by the N photosensitive transistors in each test sub-circuitry includes: storing, by the reversed-phase integrator 101 in the first test sub-circuitry 11, electric charges generated by the leakage current in the N photosensitive transistors coupled to the reversed-phase integrator 101 to obtain a first output voltage, and transmitting the first output voltage to the first input end In1 of the control sub-circuitry 20; storing, by the reversed-phase integrator 101 in the second test sub-circuitry 12, electric charges generated by the leakage current in the N photosensitive transistors coupled to the reversed-phase integrator 101 to obtain a second output voltage, and transmitting the second output voltage to the second input end In2 of the control sub-circuitry 20; and determining, by the control sub-circuitry 20, the luminous flux detected by the N photosensitive transistors in the first test sub-circuitry 11 in accordance with the first output voltage and the second output voltage.

According to the luminous flux test method in the embodiments of the present disclosure, the reversed-phase integrator 101 accumulates the electric charges generated by the leakage current in the photosensitive transistors in the sampling time period, so it is able to improve the accuracy of the stable first output voltage and the stable second output voltage, thereby to improve the accuracy of the determined luminous flux.

In some embodiments of the present disclosure, the test method further includes, at a resetting stage, resetting the N photosensitive transistors in each of the two test sub-circuitries.

As shown in FIG. 2, for example, when each of the photosensitive transistors is an NMOS transistor, the potentials at the gate electrode V1 and the input end V2 of each of the photosensitive transistors are reset to 0 when a sampling process in one frame is about to be ended (i.e., when Vout1' and Vout2' are stable) and after the method enters the resetting stage, so as to reset the N photosensitive transistors.

For example, in the test method, each frame includes the sampling stage and the resetting stage. At the sampling stage, Vout1' and Vout2' change until they are maintained in a stable state; and at the resetting stage, all of the N photosensitive transistors and the capacitor units are reset.

In some embodiments of the present disclosure, each reversed-phase integrator 101 includes a first operational amplifier, a first resistor unit, a second resistor unit, and a capacitor unit. A first end of the first resistor unit is used as the first input end of the reversed-phase integrator, and a second end of the first resistor unit is coupled to a first input end of the first operational amplifier. A first end of the second resistor unit is used as the second input end of the reversed-phase integrator, and a second end of the second resistor unit is coupled to a second input end of the first operational amplifier. A first end of the capacitor unit is coupled to the first input end of the first operational amplifier, a second end of the capacitor unit is coupled to an output end of the first operational amplifier, and the output end of the first operational amplifier is used as the output end of the reversed-phase integrator. The test sub-circuitry further includes a control unit 102 coupled to the control signal input end, a first end of the capacitor unit and a second end of the capacitor unit. The test method further includes: at the sampling stage, controlling, by the control unit 102, the first end of the capacitor unit to be electrically decoupled from the second end of the capacitor unit under the control of a control signal Vk from a control signal input end; and at the resetting stage, controlling, by the control unit 102, the first end of the capacitor unit to be electrically coupled to the second end of the capacitor unit under the control of the control signal Vk from the control signal input end.

According to the test method in the embodiments of the present disclosure, at the sampling stage, the control unit 102 controls the first end of the capacitor unit to be electrically decoupled from the second end of the capacitor unit, so as to enable the reversed-phase integrator 101 to accumulate the electric charges generated by the leakage current. At the resetting stage, the control unit 102 controls the first end of the capacitor unit to be electrically coupled to the second end of the capacitor unit, so as to discharge and reset the capacitor unit C1 and the capacitor unit C2, thereby to ensure the sampling accuracy in a next frame.

The present disclosure further provides in some embodiments a display panel integrated with the above-mentioned luminous flux test circuitry.

For example, at least one of the luminous flux test circuitries is integrated in the display panel. The display panel includes a display region and a non-display region surrounding the display region. The luminous flux test circuitries are arranged at an edge of the display region of the display panel, or the luminous flux test circuitries are arranged in the non-display region of the display panel.

For example, the display panel includes a liquid crystal display panel, or an organic light-emitting diode display panel.

According the display panel in the embodiments of the present disclosure, it is able to integrate the luminous flux test circuitries in the display panel, thereby to save the cost and space of the whole machine.

In some embodiments of the present disclosure, the display panel includes a thin film transistor, a type of each of the photosensitive transistors in the luminous flux test circuitry is the same as a type of the thin film transistor, and the photosensitive transistors and the thin film transistor are formed at the same time.

For example, the thin film transistor is a transistor with a switch function, or a driving transistor in a sub-pixel driving circuitry of the display panel.

For example, all the thin film transistors and the photosensitive transistors are a-Si transistors.

Based on the above, it is able to form the photosensitive transistors and the thin film transistors in the display panel at the same time, so as to reduce the manufacture cost of the luminous flux test circuitry.

In some embodiments of the present disclosure, the display panel further includes a first signal line and a second signal line, the first signal line is coupled to the gate electrodes of the photosensitive transistors, and the second signal line is coupled to the input ends of the photosensitive transistors.

For example, the first signal line and the second signal line are existing signal lines in a display substrate, and they are used to provide signals for other structures in the display panel and provide signals for the photosensitive transistors.

Based on the above, it is able to simplify the whole structure of the display panel and reduce the complexity of the display panel.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A luminous flux test circuitry, comprising two test sub-circuitries, a control sub-circuitry and a light-shielding pattern, wherein each of the two test sub-circuitries comprises N photosensitive transistors, where N is a positive integer greater than or equal to 1;

an output end of each of the N photosensitive transistors in a first test sub-circuitry of the two test sub-circuitries is coupled to a first input end of the control sub-circuitry;

an output end of each of the N photosensitive transistors in a second test sub-circuitry of the two test sub-circuitries is coupled to a second input end of the control sub-circuitry;

the light-shielding pattern covers the N photosensitive transistors in the second test sub-circuitry; at a sampling stage, the N photosensitive transistors in each test sub-circuitry are in a reverse bias state; and the control sub-circuitry is configured to determine luminous flux detected by the N photosensitive transistors in the first test sub-circuitry in accordance with a leakage current generated by the N photosensitive transistors in each test sub-circuitry.

2. The luminous flux test circuitry according to claim 1, wherein each of the two test sub-circuitries further comprises a reversed-phase integrator, a first input end of the reversed-phase integrator is coupled to the output end of each of the N photosensitive transistors, and a second input end of the reversed-phase integrator is coupled to a grounded signal;
an output end of the reversed-phase integrator in the first test sub-circuitry is coupled to the first input end of the control sub-circuitry, and an output end of the reversed-phase integrator in the second test sub-circuitry is coupled to the second input end of the control sub-circuitry; and
at the sampling stage, the reversed-phase integrator in the first test sub-circuitry is configured to store electric charges generated by the leakage current in the N photosensitive transistors coupled to the reversed-phase integrator to obtain a first output voltage, and transmit the first output voltage to the first input end of the control sub-circuitry; the reversed-phase integrator in the second test sub-circuitry is configured to store electric charges generated by the leakage current in the N photosensitive transistors coupled to the reversed-phase integrator to obtain a second output voltage, and transmit the second output voltage to the second input end of the control sub-circuitry; and the control sub-circuitry is configured to determine the luminous flux detected by the N photosensitive transistors in the first test sub-circuitry in accordance with the first output voltage and the second output voltage.

3. The luminous flux test circuitry according to claim 2, wherein each reversed-phase integrator comprises a first operational amplifier, a first resistor unit, a second resistor unit, and a capacitor unit;
a first end of the first resistor unit is used as the first input end of the reversed-phase integrator, and a second end of the first resistor unit is coupled to a first input end of the first operational amplifier;
a first end of the second resistor unit is used as the second input end of the reversed-phase integrator, and a second end of the second resistor unit is coupled to a second input end of the first operational amplifier; and
a first end of the capacitor unit is coupled to the first input end of the first operational amplifier, a second end of the capacitor unit is coupled to an output end of the first operational amplifier, and the output end of the first operational amplifier is used as the output end of the reversed-phase integrator.

4. The luminous flux test circuitry according to claim 3, wherein each test sub-circuitry further comprises a control unit coupled to a control signal input end, the first end of the capacitor unit and the second end of the capacitor unit, and configured to control the first end of the capacitor unit to be electrically coupled to or electrically decoupled from the second end of the capacitor unit under the control of a control signal from the control signal input end.

5. The luminous flux test circuitry according to claim 4, wherein the control sub-circuitry comprises a first analog-to-digital converter, a second analog-to-digital converter and a control chip;
an input end of the first analog-to-digital converter is used as the first input end of the control sub-circuitry, and an output end of the first analog-to-digital converter is coupled to the control chip; and
an input end of the second analog-to-digital converter is used as the second input end of the control sub-circuitry, and an output end of the second analog-to-digital converter is coupled to the control chip.

6. The luminous flux test circuitry according to claim 2, wherein the control sub-circuitry comprises a first analog-to-digital converter, a second analog-to-digital converter and a control chip;
an input end of the first analog-to-digital converter is used as the first input end of the control sub-circuitry, and an output end of the first analog-to-digital converter is coupled to the control chip; and
an input end of the second analog-to-digital converter is used as the second input end of the control sub-circuitry, and an output end of the second analog-to-digital converter is coupled to the control chip.

7. The luminous flux test circuitry according to claim 3, wherein each test sub-circuitry further comprises a reversed-phase operational amplifier, an in-phase input end of the reversed-phase operational amplifier is coupled to the grounded signal, and a reversed-phase input end of the reversed-phase operational amplifier is coupled to the output end of the first operational amplifier;
an output end of the reversed-phase operational amplifier in the first test sub-circuitry is coupled to the first input end of the control sub-circuitry; and
an output end of the reversed-phase operational amplifier in the second test sub-circuitry is coupled to the second input end of the control sub-circuitry.

8. The luminous flux test circuitry according to claim 7, wherein the control sub-circuitry comprises a first analog-to-digital converter, a second analog-to-digital converter and a control chip;
an input end of the first analog-to-digital converter is used as the first input end of the control sub-circuitry, and an output end of the first analog-to-digital converter is coupled to the control chip; and
an input end of the second analog-to-digital converter is used as the second input end of the control sub-circuitry, and an output end of the second analog-to-digital converter is coupled to the control chip.

9. The luminous flux test circuitry according to claim 3, wherein the control sub-circuitry comprises a first analog-to-digital converter, a second analog-to-digital converter and a control chip;
an input end of the first analog-to-digital converter is used as the first input end of the control sub-circuitry, and an output end of the first analog-to-digital converter is coupled to the control chip; and
an input end of the second analog-to-digital converter is used as the second input end of the control sub-circuitry, and an output end of the second analog-to-digital converter is coupled to the control chip.

10. The luminous flux test circuitry according to claim 1, wherein the control sub-circuitry comprises a first analog-to-digital converter, a second analog-to-digital converter and a control chip;
an input end of the first analog-to-digital converter is used as the first input end of the control sub-circuitry, and an output end of the first analog-to-digital converter is coupled to the control chip; and
an input end of the second analog-to-digital converter is used as the second input end of the control sub-circuitry, and an output end of the second analog-to-digital converter is coupled to the control chip.

11. The luminous flux test circuitry according to claim 1, wherein in the case that N is greater than 1, gate electrodes of the N photosensitive transistors are coupled to each other and input ends of the N photosensitive transistors are coupled to each other in a same test sub-circuitry.

12. The luminous flux test circuitry according to claim 11, wherein the gate electrodes of the N photosensitive transistors in the first test sub-circuitry are coupled to the gate electrodes of the N photosensitive transistors in the second test sub-circuitry; and the input ends of the N photosensitive transistors in the first test sub-circuitry are coupled to the input ends of the N photosensitive transistors in the second test sub-circuitry.

13. A luminous flux test method, for the luminous flux test circuitry according to claim 1, comprising, at the sampling stage, enabling the N photosensitive transistors in each test sub-circuitry to be in the reverse bias state, and determining, by the control sub-circuitry, the luminous flux detected by the N photosensitive transistors in the first test sub-circuitry in accordance with the leakage current generated by the N photosensitive transistors in each test sub-circuitry.

14. The luminous flux test method according to claim 13, wherein each of the two test sub-circuitries further comprises a reversed-phase integrator, a first input end of the reversed-phase integrator is coupled to an output end of each of the N photosensitive transistors, a second input end of the reversed-phase integrator is coupled to a grounded signal, an output end of the reversed-phase integrator in the first test sub-circuitry is coupled to the first input end of the control sub-circuitry, and an output end of the reversed-phase integrator in the second test sub-circuitry is coupled to the second input end of the control sub-circuitry,
wherein the determining, by the control sub-circuitry, the luminous flux detected by the N photosensitive transistors in the first test sub-circuitry in accordance with the leakage current generated by the N photosensitive transistors in each test sub-circuitry comprises:
storing, by the reversed-phase integrator in the first test sub-circuitry, electric charges generated by the leakage current in the N photosensitive transistors coupled to the reversed-phase integrator to obtain a first output voltage, and transmitting the first output voltage to the first input end of the control sub-circuitry;
storing, by the reversed-phase integrator in the second test sub-circuitry, electric charges generated by the leakage current in the N photosensitive transistors coupled to the reversed-phase integrator to obtain a second output voltage, and transmitting the second output voltage to the second input end of the control sub-circuitry; and
determining, by the control sub-circuitry, the luminous flux detected by the N photosensitive transistors in the first test sub-circuitry in accordance with the first output voltage and the second output voltage.

15. The luminous flux test method according to claim 14, further comprising, at a resetting stage, resetting the N photosensitive transistors in each of the two test sub-circuitries.

16. The luminous flux test method according to claim 15, wherein each reversed-phase integrator comprises a first operational amplifier, a first resistor unit, a second resistor unit, and a capacitor unit,
a first end of the first resistor unit is used as the first input end of the reversed-phase integrator, and a second end of the first resistor unit is coupled to a first input end of the first operational amplifier,
a first end of the second resistor unit is used as the second input end of the reversed-phase integrator, and a second end of the second resistor unit is coupled to a second input end of the first operational amplifier,
a first end of the capacitor unit is coupled to the first input end of the first operational amplifier, a second end of the capacitor unit is coupled to an output end of the first operational amplifier, and the output end of the first operational amplifier is used as the output end of the reversed-phase integrator,
the test sub-circuitry further comprises a control unit coupled to a control signal input end, the first end of the capacitor unit and the second end of the capacitor unit,
wherein the luminous flux test method further comprises:
at the sampling stage, controlling, by the control unit, the first end of the capacitor unit to be electrically decoupled from the second end of the capacitor unit under the control of a control signal from the control signal input end; and
at the resetting stage, controlling, by the control unit, the first end of the capacitor unit to be electrically coupled to the second end of the capacitor unit under the control of the control signal from the control signal input end.

17. A display panel, integrated with the luminous flux test circuitry according to claim 1.

18. The display panel according to claim 17, wherein the display panel comprises a thin film transistor, a type of each of the photosensitive transistors in the luminous flux test circuitry is the same as a type of the thin film transistor, and the photosensitive transistors and the thin film transistor are formed at the same time.

19. The display panel according to claim 17, further comprising a first signal line and a second signal line, the first signal line is coupled to the gate electrodes of the photosensitive transistors, and the second signal line is coupled to the input ends of the photosensitive transistors.

* * * * *